(12) United States Patent
Cripe (10) Patent No.: US 8,928,413 B1
(45) Date of Patent: Jan. 6, 2015

(54) BROADBAND CLASS-E OUTPHASING AMPLIFIER WITH ASYMMETRICAL SHUNT TUNED SWITCHES SYSTEM AND RELATED METHOD

(71) Applicant: David W. Cripe, Mount Vernon, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 61 days.

(21) Appl. No.: 13/674,203

(22) Filed: Nov. 12, 2012

(51) Int. Cl.
*H03F 3/68* (2006.01)
*H03F 3/193* (2006.01)
*H03F 3/217* (2006.01)

(52) U.S. Cl.
CPC .................................... *H03F 3/2176* (2013.01)
USPC ............................................ 330/295; 330/305

(58) Field of Classification Search
CPC .... H03F 3/2171; H03F 3/2176; H03F 3/2178
USPC ......................................... 330/251, 295, 305
See application file for complete search history.

(56) References Cited

U.S. PATENT DOCUMENTS 7,872,523 B2 *   1/2011   Sivakumar et al. ............. 330/10
8,203,386 B2 *   6/2012   van der Heijden et al. ... 330/295

* cited by examiner

*Primary Examiner* — Steven J Mottola
(74) *Attorney, Agent, or Firm* — Angel N. Gerdzhikov; Donna P. Suchy; Daniel M. Barbieri (57) ABSTRACT

A method, device and system is disclosed for high efficiency power amplification of a signal over a broad range of output power. Two broad-banded, parallel-tuned class E power amplifiers are combined through a lossless half wave transmission line combiner and configured to operate in an outphased arrangement to permit amplitude modulation. Asymmetrical shunt tuned switches are tuned for efficient amplitude modulation while asymmetrical drain inductors provide enhanced efficiency at outphased conditions over that of a symmetrical circuit. The drain source inductors and transmission components are tuned for maximum efficiency at full power output and for minimum dissipation a zero power output. At zero degrees outphasing, the circuit operates as a conventional Class-E power amplifier. However, at 180 degrees outphasing, each quarterwave line in the combiner reflects back all incident power, permitting the circuit to operate as an unloaded resonant switching circuit.

20 Claims, 8 Drawing Sheets

BROADBAND CLASS-E OUTPHASING AMPLIFIER WITH ASYMMETRICAL SHUNT TUNED SWITCHES SYSTEM AND RELATED METHOD

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. FA8650-11-C-7184 awarded by Defense Advanced Research Projects Agency (DARPA) Microscale Power Conversion (MPC).

FIELD OF THE INVENTION

The present invention relates generally to power amplification of signals including systems and methods for creating efficient power amplifiers. More particularly, embodiments of the present invention relate to improvements in power amplifier performance via power reduction, efficient amplification and increased bandwidth frequency capability such that maximum power output and maximum efficiency may contemporaneously coexist.

BACKGROUND

Traditionally, an efficient power amplifier (PA) operating in a saturated mode in one of class C, class D, class E, or class F is provided with a series modulator that is a variable modulator to the supply voltage. This variable supply input voltage from the power modulator may proportionally affect the output voltage and thus, the Radio Frequency (RF) of the power amplifier. This well-known variable input voltage technique may be known as High Level Modulation (HLM) or also as envelope elimination and restoration (EE&R) where the PA power supply is modulated with a waveform proportional to the RF envelope as described in U.S. Pat. No. 2,903,518 to Kahn.

Overall system inefficiencies, however, may be a primary negative impact of this technique. Notwithstanding the use of a well-known switch mode power amplifier, the creation of an audio waveform for the envelope modulation may be an inherently inefficient process limited to an efficiency of about 90%. These overall system efficiencies may be a combination of the efficiencies in the drain modulator and the PA.

Amplitude modulation has been applied to the output of a Class-D power amplifier using EE&R techniques. Typically, this power modulation function has been performed by a pulse-width modulation (PWM) amplifier as described in U.S. Pat. No. 3,440,566 to Swanson. Unfortunately, this PWM amplifier technique adds additional complexity and power inefficiency to the transmitter, and complex design inherencies may lead to eventual waveform distortion. In Class D operation, two devices may complementarily operate in a totem pole or push-pull methodology.

In Class F operation, two devices may traditionally operate in conjunction employing harmonic tuning to attempt to create a square wave voltage at the drain of the switching amplifier.

In Class E operation, one efficiency goal may be to obtain a drain voltage waveform representing a damped sinusoid. Well-known implementation typically may follow the teaching of U.S. Pat. No. 3,919,656 to Sokal, et. al. Sokal teaches a switched RF device embedded within a band pass filter of particular construction. This construction may traditionally comprise a shunt capacitor associated within the switch either added to or comprised wholly of the drain source capacitance parasitics of the device. Alternatively, construction may comprise a required external capacitance to form the desired reactance at the frequency of choice. In addition, a series tuned band pass circuit may allow passage of the fundamental frequency of operation while rejecting or presenting high impedance to all harmonics thereof, and a load that is represented by a resistance at the particular frequency of operation.

A digital modulation scheme has been described in U.S. Pat. No. 4,580,111 to Swanson, wherein a transmitter comprised of a sufficient quantity of discrete power amplifier modules may modulate the output amplitude of the RF waveform by selecting a number of these power amplifier modules to be disabled at any given time. This technique may eliminate some of the complexity and efficiency penalty inherent with an EE&R solution, but unfortunately requires a sufficient quantity of modules to reduce the envelope quantization below an acceptable level.

A further modulation technique is known as outphasing as described in U.S. Pat. No. 2,269,518 to Chireix, et. al., wherein the transmitter is subdivided into two halves, which are then complementarily phase modulated around the instantaneous RF carrier signal. The vector sum of these two RF waveforms is infinitely variable to zero, and, depending on the configuration of the two power amplifier sections, may be comparable in efficiency to an EE&R solution. A benefit of the outphasing system is that, unlike digital transmitter systems, it may be scalable downward to a mere two PA modules, permitting operation in lower-powered applications. Because the modulation takes place in the phase/frequency domain of the drive signal, there is no intrinsic bandwidth limitation as there is with a PWM-modulated EE&R transmitter architecture. However, outphasing had found limited success to date as applied to the various classes of PAs requiring a sacrifice of output power to achieve maximum efficiency or vice versa.

Chireix teaches a configuration in which two independent PAs are operated with outputs combined in such manner that the net output Voltage (V) is the vector sum of the RF signal generated by each individual PA. Each PA is capable of operation with independent phase control with respect the other. Consequently, when both PAs are operated in phase the output adds constructively, creating maximum output power. Similarly, when the amplifiers are operated out of phase, there exists a situation of maximum destructive interference and consequently zero output power. Thus, at any phase condition between 1) perfectly in phase and 2) perfectly out of phase, the system may produce intermediate levels of output amplitude. Chireix modulation has provided some success using two class C transmitters and has been adapted with limited success with class D solid state amplifiers.

The class E specific requirement of maintaining an output impedance that creates the desired optimal drain voltage waveform has created a barrier to implementation of Chireix modulation in the class E environment. Significant deviations from an optimal phase (e.g. outphasing) may create a mutual load modulation on each respective power amp in such a way that the impedances presented to each amp are separate and generally not benign to the operation of the amplifiers. Non-benign impedance may directly influence waveform control since class E may be more directly sensitive than some of the other classes to design impedance.

Conventional class E power amplifier RF tuning may involve feeding the drain bias (or DC supply voltage) to the amplifier through a large value RF choke. Such conventional choke methods may prove operationally successful however, limitations remain under conventional configurations concerning achieving maximum power output alongside maximum efficiency.

Additionally, a traditional class E limitation may include a sacrifice of power for efficiency. As the frequency of operation for a fixed tuned class E power amplifier is increased, its power output diminishes dramatically related to the resonant frequency of the series LC in the output network.

Bandwidth, power, and phasing limitations of the Power Modulator in turn may negatively affect the linearity and maxim modulation bandwidth of the transmitter itself. In consideration of efficiency limitations combined with bandwidth and power limitations, the current invention brings a novel approach to overcome these challenges.

SUMMARY

Accordingly, a method for amplitude modification of a signal, comprises receiving an input signal, configuring a first power amplifier to operate at a first drive phase, configuring a second power amplifier to operate at a second drive phase, combining the first power amplifier and the second power amplifier with a lossless half-wave transmission line combiner, the lossless half-wave transmission line combiner including at least one quarterwave transmission line, coupling asymmetrical drain inductors to each of the power amplifiers, tuning the asymmetrical drain inductors to maximize efficiency at a high power out setting, tuning the asymmetrical drain inductors to minimize dissipation at a low power out setting, outphasing the first power amplifier and the second power amplifier to induce amplitude modulation of the input signal, limiting the outphasing to force the second drive phase to lag the first drive phase, wherein at 180 degrees of outphasing, each quarterwave transmission line in the combiner reflects all incident power, filtering the amplitude modulated signal, and transmitting the amplitude modulated signal.

A device may comprise a first power amplifier, the first power amplifier configured to operate at a first drive phase, a second power amplifier, the second first power amplifier configured to operate at a second drive phase, a lossless half-wave transmission line combiner, the lossless half-wave transmission line combiner configured for combining the first power amplifier and the second power amplifier, the lossless half-wave transmission line combiner further including at least one quarterwave transmission line, an asymmetrical drain inductor coupled to each of the power amplifiers, the asymmetrical drain inductor tuned to: maximize efficiency at a high power out setting, and minimize dissipation at a low power out setting, a power switch tuned for outphasing the first power amplifier and the second power amplifier, the outphasing to induce amplitude modulation of the input signal, a limiter configured to limit the outphasing to force the second drive phase to lag the first drive phase, wherein at 180 degrees of outphasing, each quarterwave transmission line in the combiner reflects all incident power, a filter, the filter configured for filtering the amplitude modulated signal, and a transmitter configured for transmitting the amplitude modulated signal.

A system for improving efficiency at high and low power output values, comprises: a first power amplifier, the first power amplifier configured to operate at a first drive phase, a second power amplifier, the second first power amplifier configured to operate at a second drive phase, a lossless half-wave transmission line combiner, the lossless half-wave transmission line combiner configured for combining the first power amplifier and the second power amplifier, and including at least one quarterwave transmission line, an asymmetrical drain inductor coupled to each of the power amplifiers, the asymmetrical drain inductors tuned to: maximize efficiency at a high power out setting, and minimize dissipation at a low power out setting, a power switch tuned for outphasing the first power amplifier and the second power amplifier, the outphasing to induce amplitude modulation of the input signal, a limiter configured to limit the outphasing to force the second drive phase to lag the first drive phase, wherein at 180 degrees of outphasing, each quarterwave transmission line in the combiner reflects all incident power, a filter, the filter configured for filtering the amplitude modulated signal, and a transmitter configured for transmitting the amplitude modulated signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Introduction

The method and system of the present invention may preferably provide for creation of an RF power waveform able to be modulated in amplitude with high efficiency over a substantial modulation bandwidth.

In operation, the disclosed concept may preferably incorporate two, broad-banded, parallel-tuned Class-E power amplifiers. These amplifiers are preferably combined through a lossless, half-wave transmission line combiner and the resulting signal is outphased to permit amplitude modulation. The preferable design methodology may include tuning passive components to maximize efficiency at full power output, and minimize dissipation at 180 degree outphasing (e.g., zero power output).

As expected, at zero degrees outphasing, the circuit operates as a conventional Class-E power amplifier. However, at 180 degrees outphasing, each quarterwave line in the combiner reflects back all incident power, permitting the circuit to operate as an unloaded resonant switching circuit.

Asymmetrical drain inductors may preferably enhance efficiency at outphased conditions over that of a symmetrical circuit. The outphasing is preferentially such that the drive phase of one PA always lags the drive phase of the other.

The methods herein of circuit technique may preferably enhance the bandwidth capabilities of single ended, outphased class E power amplifiers. The disclosed approach may lead to improvements in size, weight, power and cost (SWP-C) performance by reducing thermal dissipation of power amplifiers, and permitting use of efficient power amplification of complex signals over a bandwidth of frequency higher than that previously attainable.

Embodiments disclosed herein may further be process flexible and may apply directly to systems using Si, SiGe, GaAs, GaN, bipolar, CMOS, FET, PHEMT, etc.

Preferably, the methods and systems disclosed may employ a switching class E power amplifier, as the RF device is operated as a switch. The switch may be hard driven into compression, wherein at one-half of the RF cycle the device has a very low voltage drop, and in the opposite half the device acts as open or with very high impedance. Within the switch, dual power amplifiers may operate whereas fine points of the device may operate outside the switch. In theory, the present invention may operate near 100% efficiency without sacrifice to maximum power output.

In operation of a preferred embodiment, the PAs may be configured such that the device switches from the off state to the on state at a condition wherein the drain source voltage from the sinusoidal waveform is nominally at zero volts. Additionally, the slope of the waveform at which point the device is switched on is also zero. These specifications may describe the set of conditions defining a class E operation and provide a set of conditions in which the device has minimal sensitivity to detuning or operating at a non-ideal output impedance.

With these various conditions set forth, the challenge of creating an amplitude modulated waveform has been overcome with the present invention without use of traditional high level modulation or EE&R techniques. One goal of the present invention may include creation of a network that presents benign impedances to each amplifier in the process of outphasing.

Class E Goal: Benign Impedance

Impedance may directly influence the final output waveform and control of the power and efficiency thereof. The question of efficiency is primary here. Non-benign impedances may result in substantial inefficiencies of operation which could be potentially destructive to employment devices.

Embodiments of the present invention may preferably provide a combining circuit for two class E PAs to permit operation in an outphasing modulation configuration and still allow each to maintain acceptable efficiency throughout the outphasing process. Additionally, the present methods and systems herein may overcome the well-known class E limitation that the frequency of maximum power output and the frequency for maximum efficiency are dissimilar.

Figure 1:
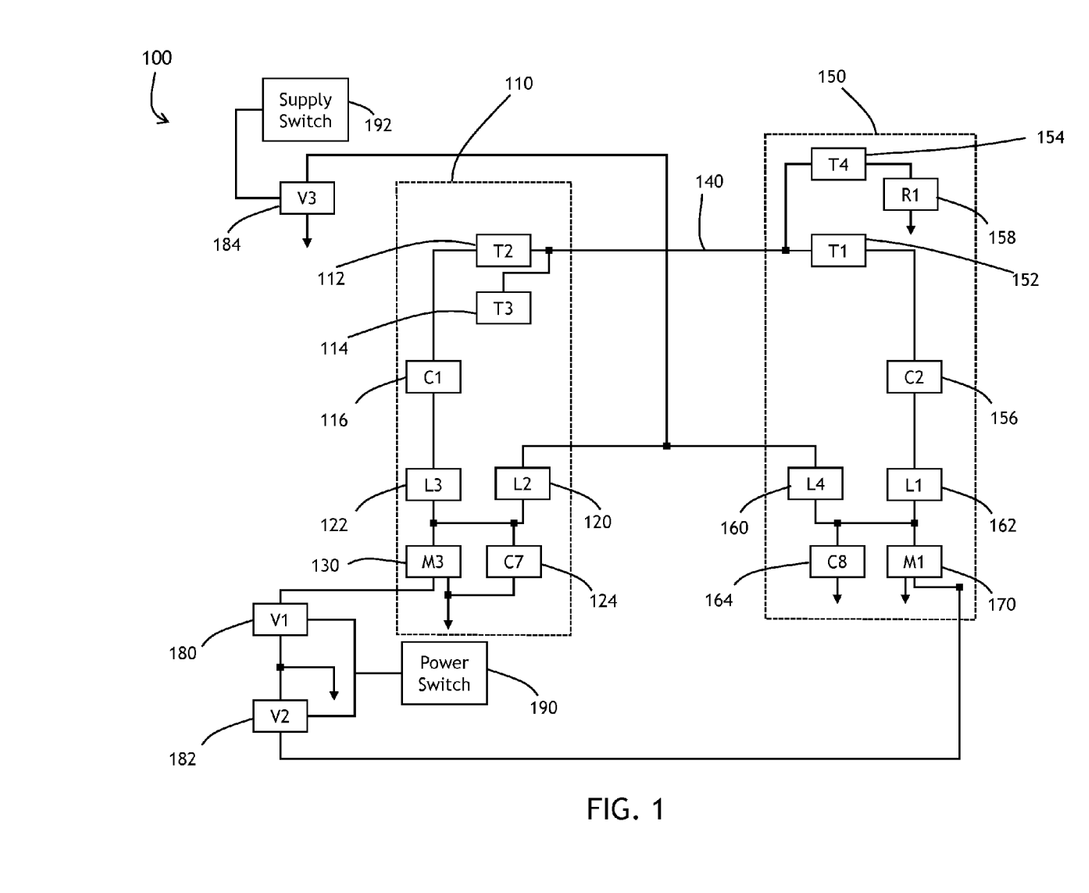
FIG. 1 is a schematic overview of a broadband class E outphasing power amplifier with asymmetric shunt tuned switches in accordance with a preferred embodiment of the present invention.

Referring to FIG. 1 schematic overview of a broadband class E outphasing power amplifier with asymmetric shunt tuned switches in accordance with a preferred embodiment of the present invention is shown.

The system 100 may be organized into two sides: a first side 110 and a second side 150. PA M3 130 may operate on first side 110 while PA M1 170 may operate on second side 150. Voltage sources V1 and V2 180 are the phase modulated RF drive signals for M3 130 and M1 170 respectively. Voltage source V3 184 is the supply voltage for the circuit. Power switch 190 may control the tuning and connectivity of the input power of either or both of voltage sources V1 180 and V2 182. Supply switch 192 may control connectivity of supply voltage V3 184.

The current invention may deviate from and enhance the traditional configuration of the class E power amplifier which feeds the drain bias (or DC supply voltage) V3 184 to the amplifier through an asymmetrical drain inductor (large value RF choke) L2 120 and L4 160. The novel configuration may feed the drain bias through a finite value inductor which in conjunction with the drain source capacitance, forms one element (L2 120-C7 124 and L4 160-C8 164) of a band pass filter that is nominally tuned towards a center frequency. A series LC (L3 122-C1 116 and L1 162-C2 156) connecting the drain of the switching device to its output is a relatively low quality band pass also tuned to the center frequency with a nominal quality (Q) of approximately one.

To combine the two power amplifiers 130 170, the present invention may preferably employ two quarter wave transmission lines T2 112 and T1 152 connected in series with the output at the common center node 140 of the two. In this configuration, the two quarter wave transmission lines 112/152 behave similar to a non-isolated combiner. Thus, when the RF signals at the two extreme ends of the transmission lines are in phase, they sum to the center node 140 which is terminated in an RF impedance T4 154 which is resistive R1 158 at nominally one-half the characteristic impedance of each transmission line.

Filter transmission line section T3 114 may operate as generic frequency filter. In one embodiment, filter T3 114 may operate a grounded quarter wave stub with the purpose of notching out second harmonic content. Elimination of the second harmonic from the output may provide filtering function and reduction of the second harmonic current present in the power amplifiers.

Destructive Outphasing

Figure 2:
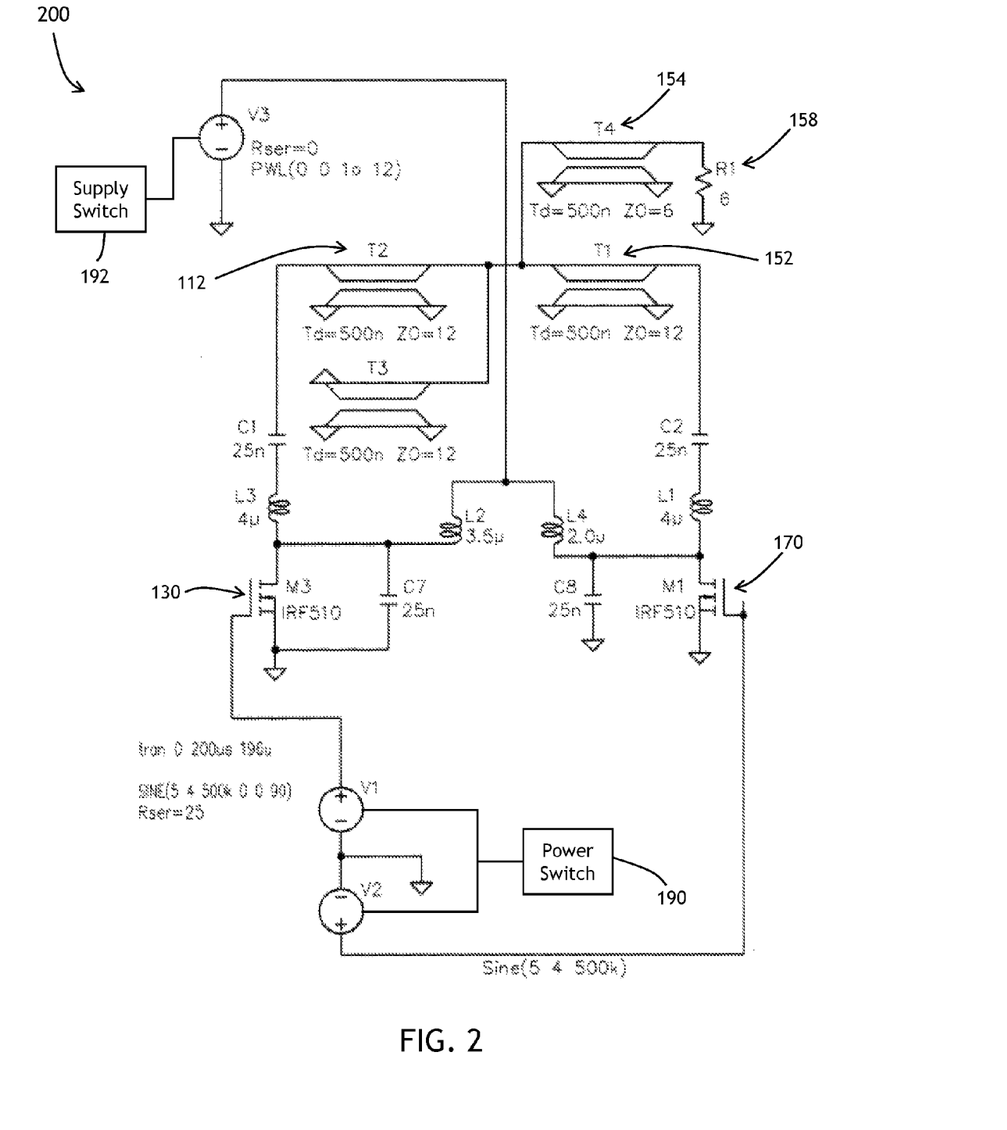
FIG. 2 is a detailed schematic of a broadband class E outphasing power amplifier with asymmetric shunt tuned switches in accordance with preferred embodiment of the present invention.

Referring to FIG. 2, a detailed schematic of a broadband class E outphasing power amplifier with asymmetric shunt tuned switches in accordance with preferred embodiment of the present invention is shown.

Transmission lines T1 152 and T2 112 may be preferably terminated through quarter wave section T4 154 which may provide a desired impedance transformation to the final RF load R1 158. When devices M1 170 and M3 130 are operating in phase, RF signals enter T1 152 and T2 112 synchronously and traverse to the center node 140. The synchronous signal proceeds to T4 154 and R1 158 which is one-half of the characteristic impedance of each line T1 152 and T2 112.

Referring generally to FIGS. 1 and 2, if M1 170 and M3 130 are operated out of phase, signals enter outside terminals of T1 152 and T2 112 at 180 degrees out of phase. Since the combination of T1 152 and T2 112 is a half wave total, center node 140 is presented with a high impedance at the extremes of T1 152 and T2 112 resulting in a net zero voltage at the center node 140. Consequently, a high impedance is presented to M1 170 and M3 130, the switching transistors. As a result, a resonance of L2 120 C7124 or L4 160 C8 164 corresponds to the drain source capacitance of each device. Permitting a resonance to occur and a benign waveform on each transistor leaving minimum dissipation occurring within the transistors.

Power Amplifier Goal: Maximum Power at Maximum Efficiency

Figure 3:
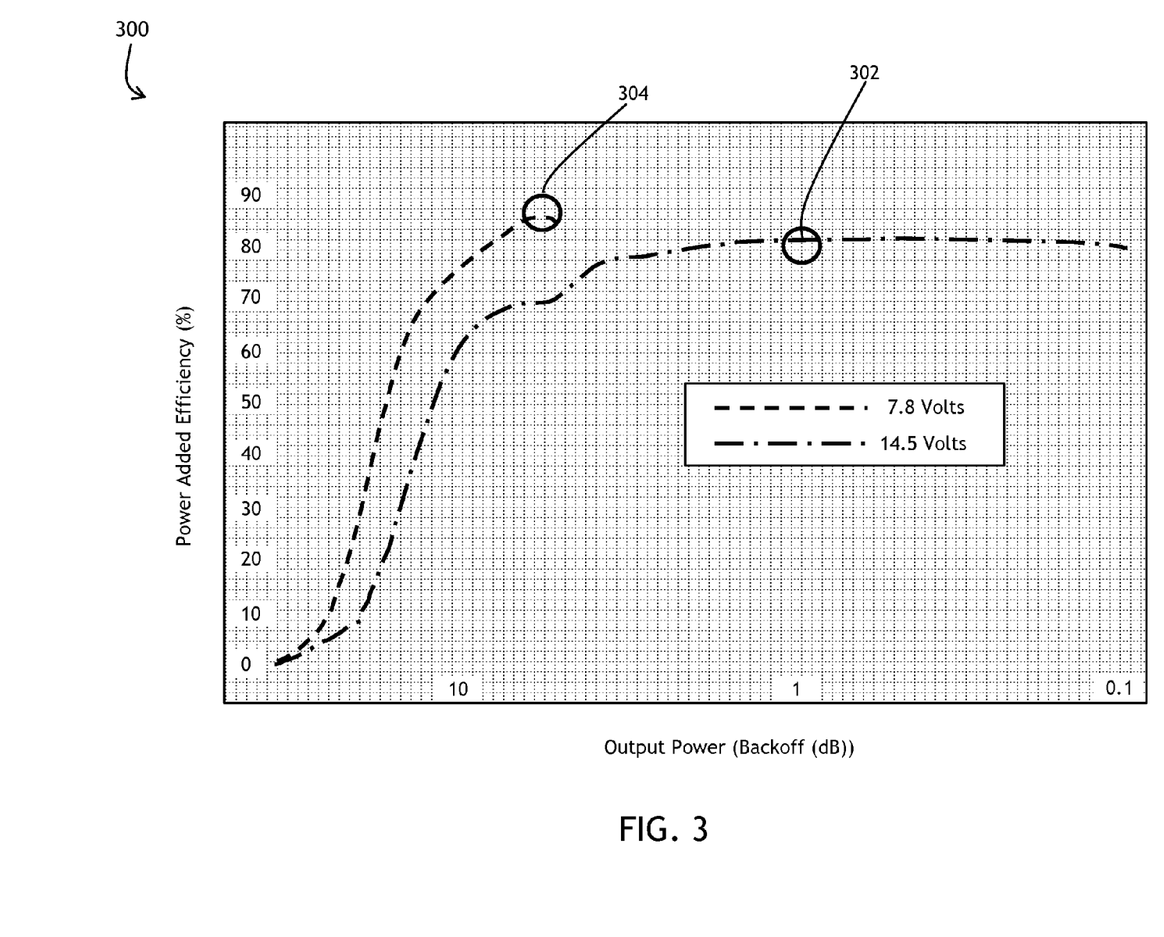
FIG. 3 is a graph of power amplifier output power (backoff from maximum) vs. peak added efficiency (%) in accordance with a preferred embodiment of the present invention.

Referring to FIG. 3, graph of power amplifier output power (backoff from maximum) vs. peak added efficiency (%) in accordance with a preferred embodiment of the present invention is shown. Traditionally, a sacrifice must be made between one of power output and efficiency in order to achieve the maximum of either. To meet this desired class E attribute, a class E circuit of the present invention may be configured such that the frequency of maximum power output and the frequency of max efficiency are the same. For example, at 14.5 volts, there is a flat or at least symmetrical function of power output deviation from an efficiency center point 302. Point 302 indicates an efficiency value of 80% at a power backoff of 1 dB from maximum power. Of note, as backoff is increased or decreased from 1, the efficiency at 14.5 volts remains nearly constant.

At lower power settings, embodiments of the present invention may further increase efficiency with decreased power out (increased backoff from maximum). For example, at 7.8 volts, the output power backoff may be further increased while maintaining greater efficiency. Point 304 may indicate a backoff from maximum of 9 dB while efficiency is measured at 86%. These greater efficiency values over a broad power output range as found in the present invention may indicate substantial advantages over prior art PAs.

As used herein well-known drain efficiency may be derived from measured DC power from the voltage supply and measured RF power in the load termination where the efficiency is the ratio of RF power out to DC input power.

Intermediate Conditions

In operation between purely in phase and purely out of phase, variable levels of efficiency may be provided based on desired power output and desired efficiency.

Figure 4:
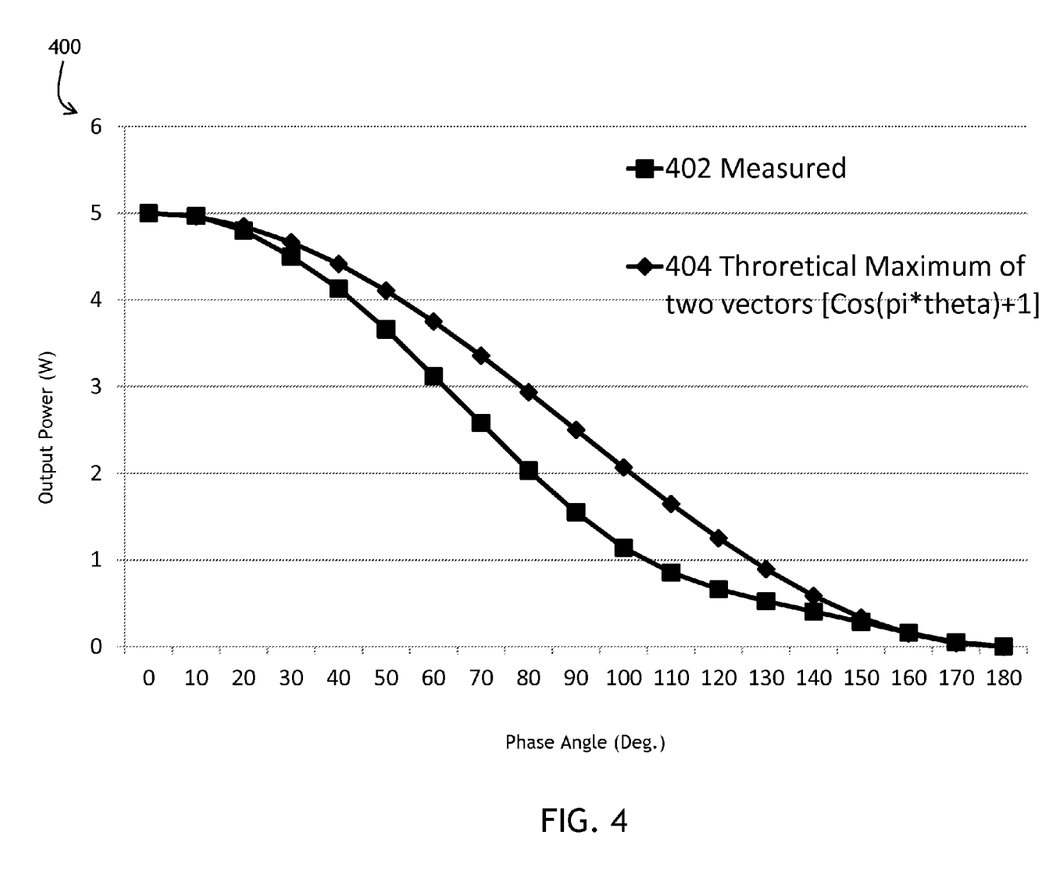
FIG. 4 is a graph of overall PA output power in watts over phase angle of the individual PAs showing measured data and a theoretical maximum in accordance with a preferred embodiment of the present invention.

Referring to FIG. 4, a graph of overall PA output power in watts over phase angle of the individual PAs showing measured data and a theoretical maximum in accordance with a preferred embodiment of the present invention is shown. Output power in watts at phase angles between zero and 180 may preferably indicate system output of the two PAs.

Preferably, alteration of the phase input between the drive of M1 170 and M3 130 offers variable output amplitude of the system For example, operating in phase may result in maximum power out, and operating out of phase may result in zero power out. Any condition in between zero and purely outphased may result in control of the modulation of the amplitude of the transmitter. This amplitude modulation based on phase shift may result in acceptable efficiency values. Operating the devices in phase may be similar to classical class E drain waveforms. At theoretical 100% efficiency.

As shown in FIG. 4, if the outphasing is set at a 90 degree difference in drive phase between the two PAs (M1 170 and M3 130), the theoretical maximum of the two vectors [Cos(pi*theta)+1] 404 output power is dropped to 50% of the maximum output power which equates to one-half of the maximum voltage. Measured values 402 may indicate an increased power output with increasing phase (to approximately 25% of the maximum).

Figure 5:
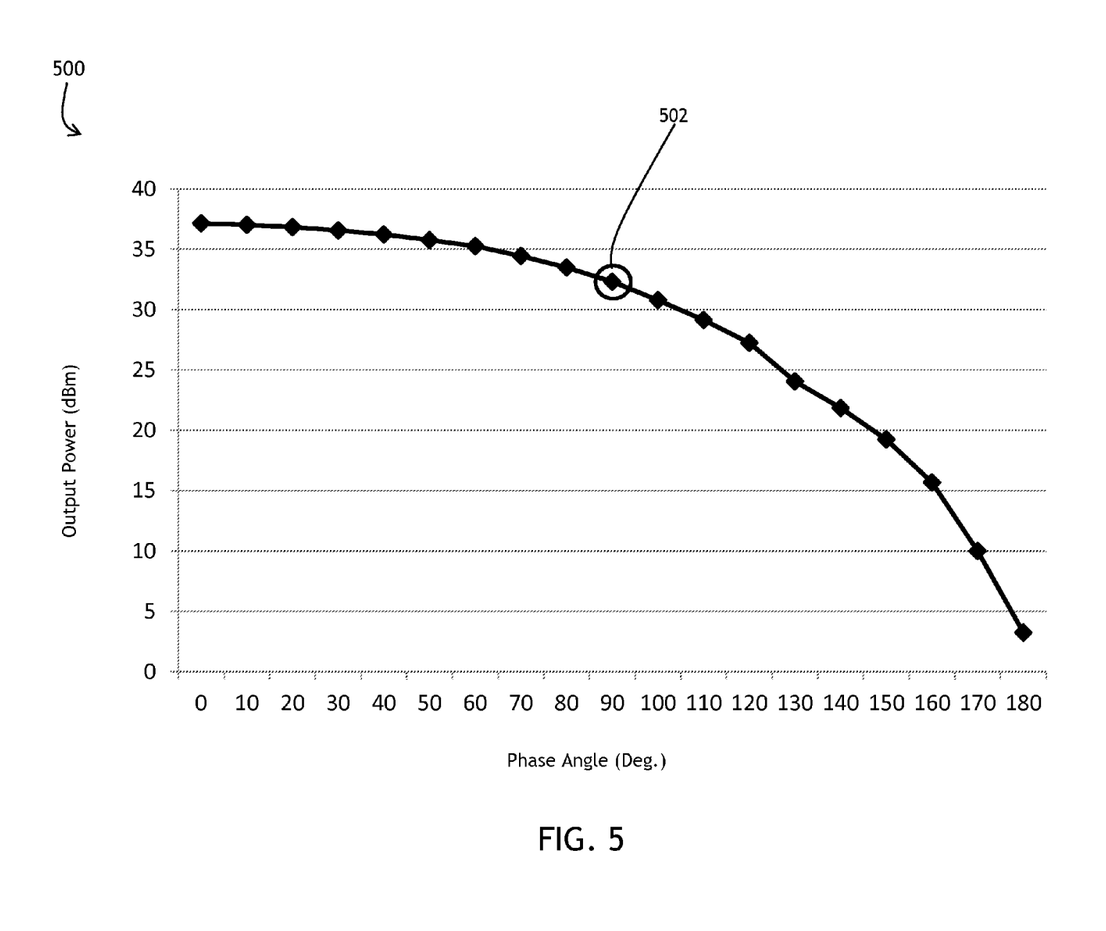
FIG. 5 is a graph of overall PA output power in dB over phase angle of the individual PAs in accordance with a preferred embodiment of the present invention.

Phase angle change may directly affect power output. Referring to FIG. 5, graph of overall PA output power in dB over phase angle of the individual PAs in accordance with a preferred embodiment of the present invention is shown. For example, point 502 may indicate a 90 degree shift in phase angle and a relatively insignificant drop in power output from 37 dBm at zero phase to 32 dBm at 90 degrees.

Figure 6:
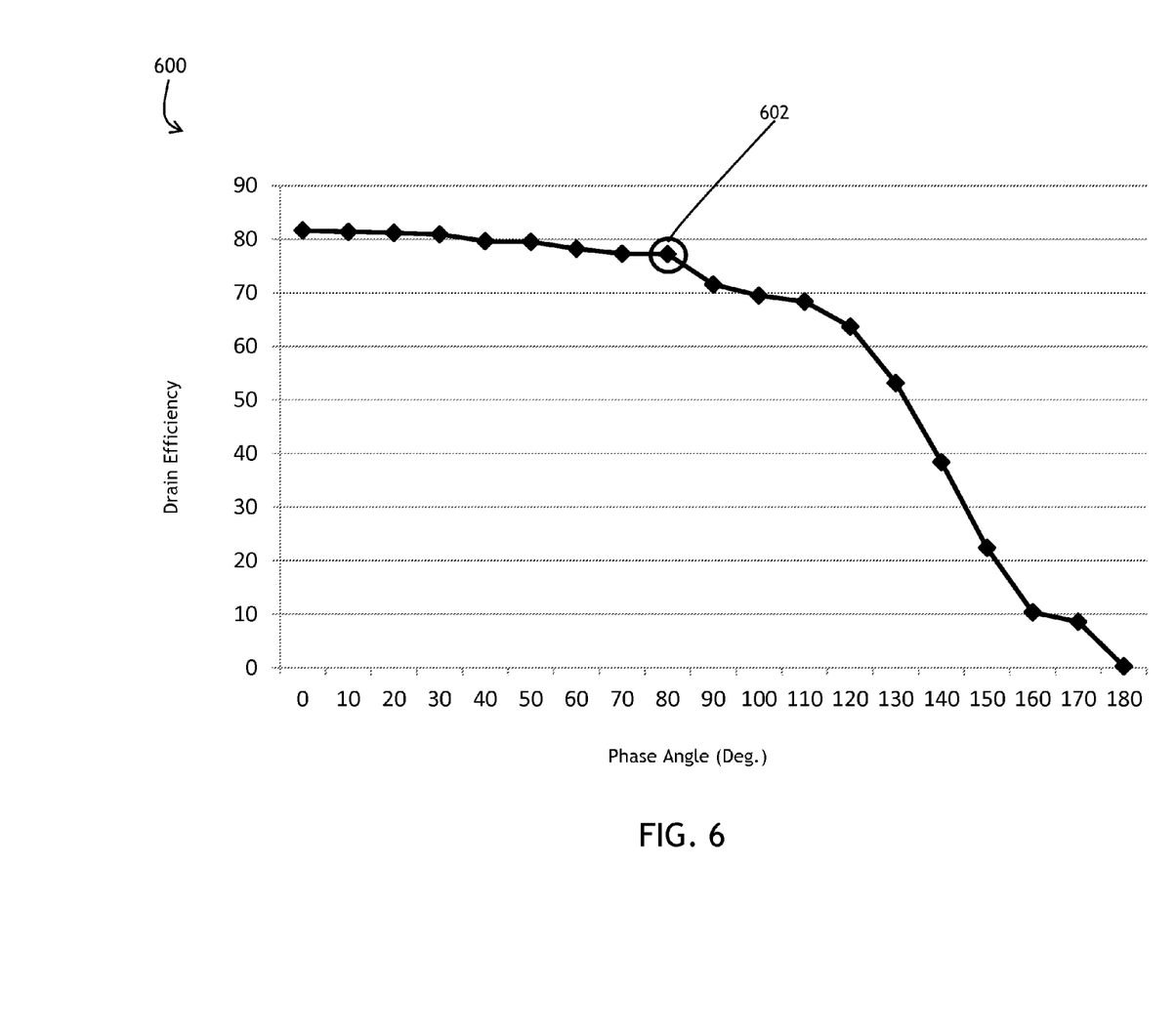
FIG. 6 is a graph of drain efficiency over phase angle of the individual PAs in accordance with a preferred embodiment of the present invention.

Phase angle change may also affect efficiency. For example, at greater angles of outphasing, efficiency may be reduced. Referring to FIG. 6, a graph of drain efficiency over phase angle of the individual PAs in accordance with a preferred embodiment of the present invention is shown. From a peak efficiency of approximately 82% at zero outphasing, embodiments of the present invention provide efficiency values remaining above 75% at 80 degrees of outphasing. Point 602 indicates 77% drain efficiency at 80 degrees of outphasing between PAs M1 170 and M3 130. This relatively flat efficiency between zero and 80 degrees of outphasing may allow needed flexibility in outphasing requirements Phase Preference Asymmetric phase values may drive a preferred efficiency based relationship between the two PAs. Skillful artisans may recognize an optimum value for phase offset between two PAs in class E as determined by classical class E drain waveforms. For example, should asymmetric phase offset values be input to the two devices (M1 170, M3 120) as compared to the optimal phase offset values, there may be a preference for such phase relationship during outphasing M1 170 and M3 120. To accomplish the preferred phase relationship between the two devices, a refinement in the asymmetrical drain inductors L2 120 and L4 160 is required. For example, if the value of L2 is 1.4 times the nominal and the value of L4 is 0.83 of the optimal value, a consequent phase retardation of M3 130 with respect to M1, may result in a higher efficiency than when the opposite is true. Those of skill in the art may realize optimal and nominal values as modified herein to accomplish the phase retardation.

Figure 7:
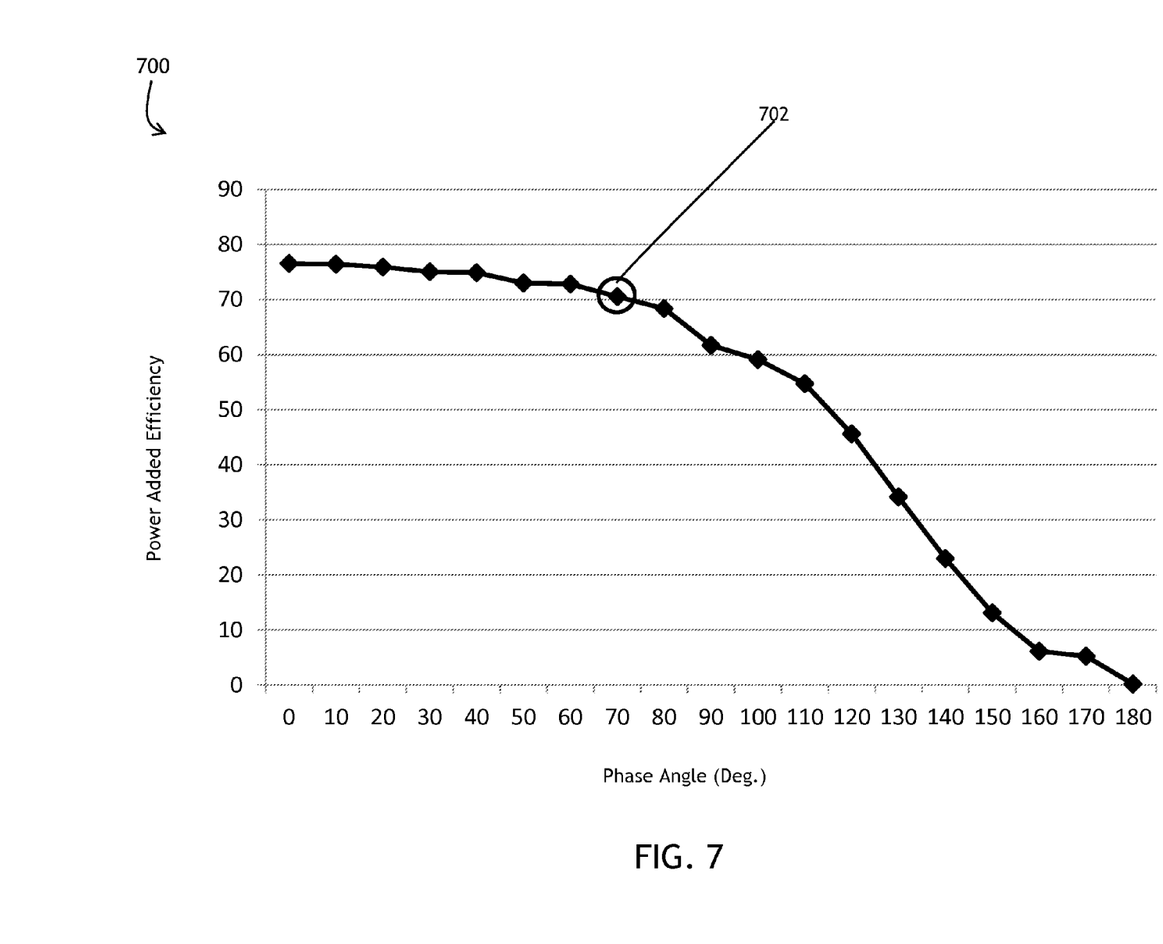
FIG. 7 is a graph of power added efficiency over phase angle of the individual PAs in accordance with a preferred embodiment of the present invention.

Such phase preference may be represented in FIG. 7. Referring to FIG. 7, a graph of power added efficiency over phase angle of the individual PAs in accordance with a preferred embodiment of the present invention is shown. Similar to the drain efficiency, power added efficiency may remain relatively flat and greater than 70% between zero phase and 70 degrees outphasing. Point 702 indicates 71% power added efficiency at 70 degrees outphasing.

In operation, a crest of efficiency may occur during intermediate outphasing since for all realistic modulation waveforms, the time spent at max power output is very small. Generally during a majority of time, the PAs may preferably operate at some intermediate value. Realizing that an operator may control the drive waveforms in such a way that one drive has a waveform always leading that of the other, we may selectively modify the values of the two drain chokes in such a way as to optimize the efficiency.

Applicability to Additional Classes

The present invention may preferably be configured for efficient operation within class E power amplifiers. However, efficiency measures as applied to additional classes of power amplifiers may be recognized using techniques of the present invention. For example, applicability to class D using asymmetric shunt tuned switches may provide greater efficiencies than have been previously available. Slight modifications to the function of the asymmetric drain chokes disclosed herein may directly apply to additional classes of PAs and falls within the contemplation of this disclosure.

Figure 8:
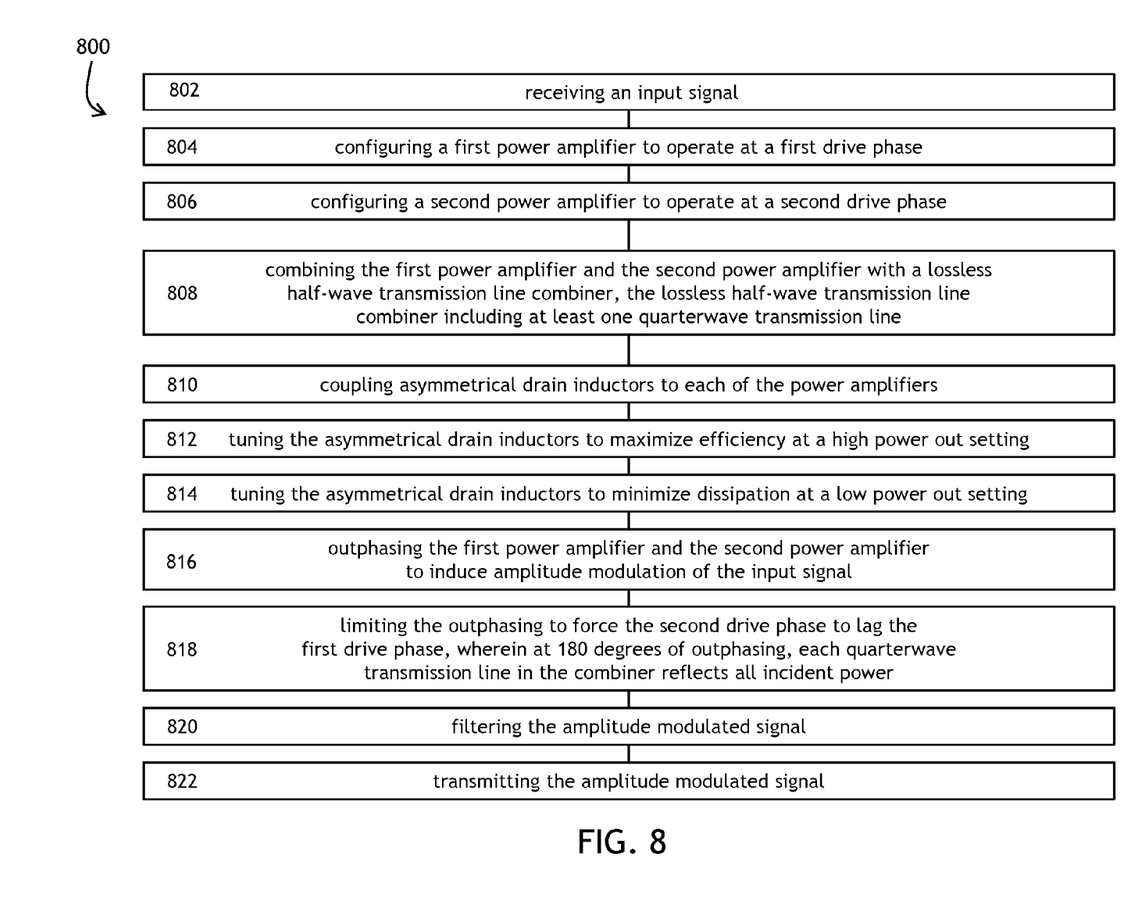
FIG. 8 is a flowchart of a method for broadband Class E outphasing with asymmetric shunt tuned switches in accordance with a preferred embodiment of the current invention.

Referring to FIG. 8, a flowchart of a method for broadband Class E outphasing with asymmetric shunt tuned switches in accordance with a preferred embodiment of the current invention is shown. Method 800 may begin, at step 802, with receiving an input signal, at step 804, configuring a first power amplifier to operate at a first drive phase, at step 806, configuring a second power amplifier to operate at a second drive phase, at step 808, combining the first power amplifier and the second power amplifier with a lossless half-wave transmission line combiner, the lossless half-wave transmission line combiner including at least one quarterwave transmission line, at step 810, coupling asymmetrical drain inductors to each of the power amplifiers, at step 812, tuning the asymmetrical drain inductors to maximize efficiency at a high power out setting, at step 814, tuning the asymmetrical drain inductors to minimize dissipation at a low power out setting, at step 816, outphasing the first power amplifier and the second power amplifier to induce amplitude modulation of the input signal, at step 818, limiting the outphasing to force the second drive phase to lag the first drive phase, wherein at 180 degrees of outphasing, each quarterwave transmission line in the combiner reflects all incident power, at step 820, filtering the amplitude modulated signal, and at step 822, transmitting the amplitude modulated signal.

CONCLUSION

Specific blocks, sections, devices, functions, processes and modules may have been set forth. However, a skilled technologist will realize that there are many ways to partition the method and system, and that there are many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the method and system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for amplitude modification of a signal, comprising:
    receiving an input signal;
    configuring a first power amplifier to operate at a first drive phase; configuring a second power amplifier to operate at a second drive phase;
    combining the first power amplifier and the second power amplifier with a lossless half-wave transmission line combiner, the lossless half-wave transmission line combiner including at least one quarterwave transmission line;
    coupling asymmetrical drain inductors to each of the power amplifiers, the asymmetrical drain inductor tuned to:
        1) maximize efficiency at a high power out setting, and
        2) minimize dissipation at a low power out setting;
    outphasing the first power amplifier and the second power amplifier to induce amplitude modulation of the input signal;
    limiting the outphasing to force the second drive phase to lag the first drive phase, wherein at 180 degrees of outphasing, each quarterwave transmission line in the combiner reflects all incident power;
    filtering the amplitude modulated signal; and
    transmitting the amplitude modulated signal.

2. The method of claim 1 wherein the first drive phase and the second drive phase are equal.

3. The method of claim 1 wherein the lossless half-wave transmission line combiner further comprises a four element transmission network including at least two quarter wave transmission lines, a filter, and an impedance terminator.

4. The method of claim 1 wherein coupling asymmetrical drain inductors to each of the power amplifiers further comprises coupling a four element band pass filter, the band pass filter nominally tuned towards a center frequency.

5. The method of claim 1 wherein tuning the asymmetrical drain inductors to maximize efficiency at a high power out setting further comprises tuning the asymmetrical drain inductors toward a center frequency.

6. The method of claim 1 wherein outphasing the first power amplifier and the second power amplifier to induce amplitude modulation of the input signal further comprises switching an input power supply from off to on when a slope of an output waveform is zero.

7. The method of claim 1 wherein filtering the amplitude modulated signal further comprises filtering at least one harmonic of an output signal.

8. A device, comprising:
    a first power amplifier, the first power amplifier configured to operate at a first drive phase;
    a second power amplifier, the second first power amplifier configured to operate at a second drive phase;
    a lossless half-wave transmission line combiner, the lossless half-wave transmission line combiner configured for combining the first power amplifier and the second power amplifier, the lossless half-wave transmission line combiner further including at least one quarterwave transmission line;

an asymmetrical drain inductor coupled to each of the power amplifiers, the asymmetrical drain inductor tuned to:
1) maximize efficiency at a high power out setting, and
2) minimize dissipation at a low power out setting;
a power switch tuned for outphasing the first power amplifier and the second power amplifier, the outphasing to induce amplitude modulation of the input signal;
a limiter configured to limit the outphasing to force the second drive phase to lag the first drive phase, wherein at 180 degrees of outphasing, each quarterwave transmission line in the combiner reflects all incident power;
a filter, the filter configured for filtering the amplitude modulated signal; and
a transmitter configured for transmitting the amplitude modulated signal.

9. The device of claim 8 wherein the first drive phase and the second drive phase are equal.

10. The device of claim 8 wherein the lossless half-wave transmission line combiner further comprises a four element transmission network including at least two quarter wave transmission lines, a filter, and an impedance terminator.

11. The device of claim 8 wherein the asymmetrical drain inductor coupled to each of the power amplifiers further comprises a four element band pass filter, the band pass filter nominally tuned towards a center frequency.

12. The device of claim 8 wherein the power switch tuned for outphasing the first power amplifier and the second power amplifier further comprises an asymmetric shunt-tuned switch.

13. The device of claim 8 wherein outphasing the first power amplifier and the second power amplifier further comprises switching an input power supply from off to on when a slope of an output waveform is zero.

14. The device of claim 8 wherein the filter further comprises a filter configured for filtering at least one harmonic of an output signal.

15. A system for improving efficiency at high and low power output values, comprising:
a first power amplifier, the first power amplifier configured to operate at a first drive phase;
a second power amplifier, the second first power amplifier configured to operate at a second drive phase;
a lossless half-wave transmission line combiner, the lossless half-wave transmission line combiner configured for combining the first power amplifier and the second power amplifier, and including at least one quarterwave transmission line;
an asymmetrical drain inductor coupled to each of the power amplifiers, the asymmetrical drain inductors tuned to:
1) maximize efficiency at a high power out setting, and
2) minimize dissipation at a low power out setting;
a power switch tuned for outphasing the first power amplifier and the second power amplifier, the outphasing to induce amplitude modulation of the input signal;
a limiter configured to limit the outphasing to force the second drive phase to lag the first drive phase, wherein at 180 degrees of outphasing, each quarterwave transmission line in the combiner reflects all incident power;
a filter, the filter configured for filtering the amplitude modulated signal; and
a transmitter configured for transmitting the amplitude modulated signal.

16. The system of claim 15 wherein the first drive phase and the second drive phase are equal.

17. The system of claim 15 wherein the lossless half-wave transmission line combiner further comprises a four element transmission network including at least two quarter wave transmission lines, a filter, and an impedance terminator, the filter configured for filtering at least one harmonic of an output signal.

18. The system of claim 15 wherein the asymmetrical drain inductor coupled to each of the power amplifiers further comprises a four element band pass filter, the band pass filter nominally tuned towards a center frequency.

19. The system of claim 15 wherein the power switch tuned for outphasing the first power amplifier and the second power amplifier further comprises an asymmetric shunt-tuned switch.

20. The system of claim 15 wherein outphasing the first power amplifier and the second power amplifier further comprises switching an input power supply from off to on when a slope of an output waveform is zero.

* * * * *